United States Patent [19]

Inoue

[11] Patent Number: 4,895,811
[45] Date of Patent: Jan. 23, 1990

[54] METHOD OF MANUFACTURING SEMICONDUCTOR DEVICE

[75] Inventor: Kazuhiko Inoue, Yokohama, Japan

[73] Assignee: Kabushiki Kaisha Toshiba, Kawasaki, Japan

[21] Appl. No.: 253,171

[22] Filed: Oct. 4, 1988

[30] Foreign Application Priority Data

Oct. 8, 1987 [JP] Japan ................................. 62-254146

[51] Int. Cl.⁴ ......................................... H01L 21/265
[52] U.S. Cl. ........................................ 437/41; 437/36; 437/38; 437/911; 148/DIG. 88; 148/DIG. 100; 148/DIG. 105; 357/15; 357/22
[58] Field of Search ................... 437/38, 39, 40, 41, 437/228, 27, 29, 36, 911; 357/15, 22; 148/DIG. 88, DIG. 100, DIG. 105

[56] References Cited

U.S. PATENT DOCUMENTS 4,561,169  12/1985  Miyazaki et al. ................ 437/203
4,729,967  3/1988  Armiento ................... 148/DIG. 88

FOREIGN PATENT DOCUMENTS 0197838  3/1986  European Pat. Off. .
2824026  12/1979  Fed. Rep. of Germany .
0143586  8/1983  Japan ................................. 437/911
0145158  8/1983  Japan ................................. 437/228
0109070  11/1983  Japan ................................. 437/29
0073676  4/1987  Japan ................................. 437/40

OTHER PUBLICATIONS

Patent Abstracts of Japan, vol. 7, No. 21 (E-155) (1166) Jan. 27, 1983 & JP-A-57 178 374 (Sumitomo Denki Kogyo K.K.) 2-11-82.
Patent Abstracts of Japan, vol. 7, No. 21 (E-155) (1166) Jan. 27, 1983 & JP-A-57 178 376 (Sumitomo Denki Kogyo K.K.) 2-11 ∝ 87.
GaAs IC Symposium, Technical Digest 1985, Nov. 12-14, 1985, Monterrey, Calif.; pp. 195-198; IEEE, New York, US, M. Wada et al., "GaAs JFET Technology for DCFL LSI".
Electronic Letters, vol. 17, No. 17, Aug., 1981; pp. 621-623; London, Great Britain, J. Kasamara et al., "Fully Ion-Implanted GaAs ICs Using Normally-Off JFETs".

*Primary Examiner*—Olik Chaudhuri
*Assistant Examiner*—Tuan Nguyen
*Attorney, Agent, or Firm*—Finnegan, Henderson, Farabow, Garrett and Dunner

[57] ABSTRACT

In a method of manufacturing a GaAsFET, an insulating film used as a mask for implanting ions to form a gate region is used as a mask for sputtering a material of a gate electrode. Consequently, the gate electrode is formed to be aligned with the gate region. A GaAsFET in which the gate electrode can be stably positioned with respect to the small gate region with a high degree of accuracy and which is suitable for high frequency applications can be manufactured.

1 Claim, 5 Drawing Sheets

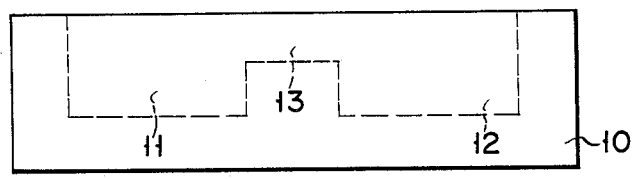
F I G. 2A
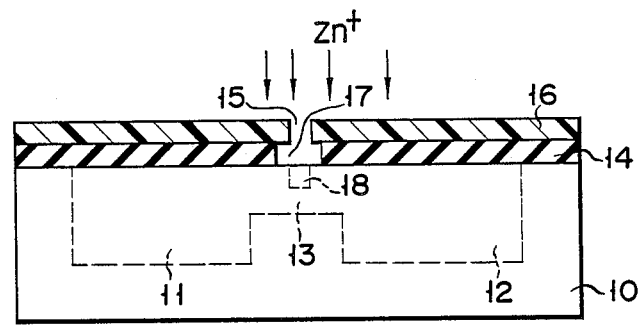
F I G. 2B
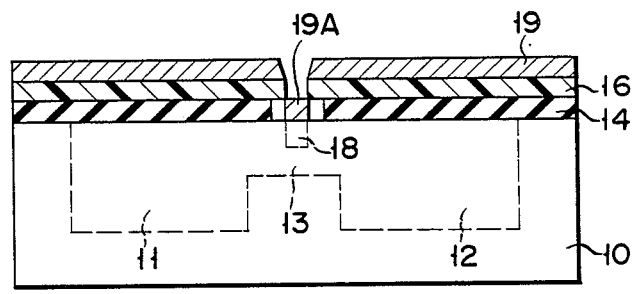
F I G. 2C
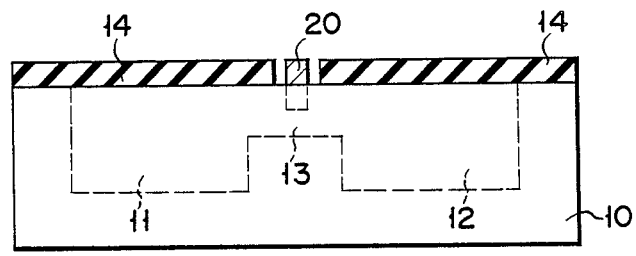
F I G. 2D

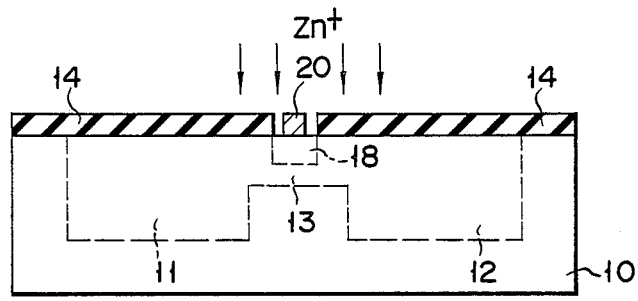
F I G. 2E
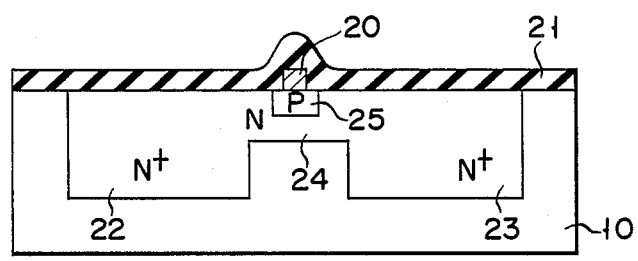
F I G. 2F
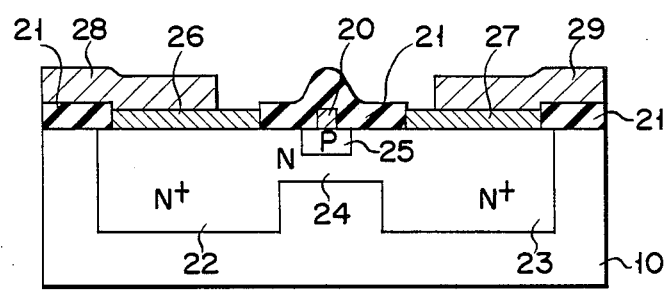
F I G. 2G
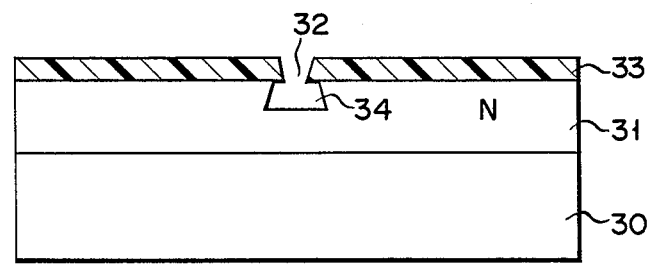
F I G. 3A

METHOD OF MANUFACTURING SEMICONDUCTOR DEVICE

BACKGROUND OF THE INVENTION

1. Field of the Invention

The present invention relates to a method of manufacturing a junction type field effect semiconductor device using a III-V Group compound semiconductor substrate.

2. Description of the Related Art

A known example of a field effect semiconductor device using a III-V Group compound semiconductor as a substrate is a GaAsFET (GaAs field effect transistor). Examples of the GaAsFET are a MES (metal semiconductor) FET and a J-FET (junction type). A so-called MES type FET using a Schottky barrier gate is widely used because its manufacturing process is simple.

Junction barrier height $\Phi B$ of the J-FET is as high as 1 V or more. Therefore, a sufficient operation margin can be obtained for a normally-off type J-FET. In addition, since either an N or P channel can be manufactured by selecting an impurity to be ion-implanted, a complementary circuit can be arranged.

The type of J-FET varies in accordance with a formation type of a gate region. That is, the J-FET has a variety of types such as a diffusion junction type, an ion-implantation junction type, and an epitaxial growth junction type. In any of the above types, however, it is difficult to perform micropatterning of a gate portion as compared with the MES type, and a micropatterning technique for the J-FET has not been developed yet. That is, in a conventional technique, a gate region is formed in a semiconductor substrate, and then a gate electrode is positioned on the gate region by mask alignment. Thereafter, the gate electrode is formed by a lift-off method or etching. Alternatively, the gate electrode is formed not directly on the gate region but on a region electrically connected to the gate region. In this case, the gate region is a small region. This is because mutual conductance gm as a performance factor of a semiconductor device is proportional to W (channel width)/L (channel length) and therefore W must be increased and L must be decreased in order to increase the value of gm. Since the gate region is a small region, it is very difficult for current techniques to stably position the gate electrode on the small region with high accuracy by mask alignment, resulting in a very poor yield. In addition, when the gate electrode is formed on the region electrically connected to the gate region, a gate resistance is increased by a resistance of this region. For this reason, as an operation frequency is increased, a noise factor (NF) is increased and a gain is reduced. Therefore, this method is not preferable as a method of manufacturing a gate portion of a high frequency FET.

As described above, in the method of positioning a gate electrode with respect to a gate region by mask alignment, the manufacturing yield is very poor. In the method of connecting a gate electrode with a gate region through a region connected to the gate region, a high frequency performance is degraded.

SUMMARY OF THE INVENTION

The present invention has been made in consideration of the above situation and has as its object to provide a method of manufacturing a semiconductor device, which can stably position a gate electrode with respect to a small gate region with high accuracy and can manufacture a semiconductor device suitable for high frequency applications.

According to the present invention, there is provided a method of manufacturing a semiconductor device, comprising the steps of: implanting ions of impurity Si in compound semiconductor substrate and forming a first ion-implantation layer of a first conductivity type on a major surface layer of the substrate; forming first insulating film on the major surface of the substrate; forming second insulating film having opening portion on the first insulating film; forming opening portion in the first insulating film by selective etching using the second insulating film as a mask; implanting ions of impurity in the first ion-implantation layer through the opening portion of the second insulating film an forming second ion-implantation layer of a second conductivity type in a surface layer thereof; forming, on the major surface of the structure, while the second insulating film remains, conductor layers in which at least a layer thereof contacting the semiconductor substrate is either a refractory metal layer or a layer containing a refractory metal; removing the second insulating film to remove conductor layer portion formed thereon, thereby forming electrode so that only conductor layer portion exposed in the opening portion of the second insulating film and formed on the substrate remains; and annealing the structure to activate the first and second ion-implantation layers.

According to the present invention, there is further provided a method of manufacturing a semiconductor device, comprising the steps of: forming semiconductor layer of a first conductivity type on compound semiconductor substrate; forming insulating film having an opening portion on a major surface of the semiconductor layer; forming groove in the semiconductor layer by selective etching using the insulating film as a mask; implanting impurity ions in the semiconductor layer through the opening portion of the insulating film and the groove of the semiconductor layer and forming ion-implantation layer of a second conductivity type in a major surface layer of the semiconductor layer exposed in the groove; forming, on a major surface of a structure, while the insulating film remains, conductor layers in which at least a layer thereof contacting the semiconductor layer is either a refractory metal layer or a layer containing a refractory metal; removing the insulating film to remove conductor layer portion formed thereon, thereby forming electrode so that only conductor layer portion exposed in the opening portion of the insulating film and formed on the semiconductor layer remains; and annealing the structure to activate the ion-implantation layer.

According to the methods of the present invention, the insulating film used as a mask during ion-implantation for forming the gate region can be used as a mask for sputtering the gate electrode material. Therefore, the gate electrode can be formed in self-alignment with the gate region.

BRIEF DESCRIPTION OF THE DRAWINGS

FIGS. 2A to 2G are sectional views showing the structures of the device formed in manufacturing steps of a method according to another embodiment of the present invention; and FIGS. 3A to 3E are sectional views showing the structures of the device formed in manufacturing steps of a method according to still another embodiment of the present invention.

DETAILED DESCRIPTION OF THE PREFERRED EMBODIMENTS

Embodiments of the present invention will be described in detail below with reference to the accompanying drawings.

FIGS. 1A to 1F are sectional views showing the structures of the device formed in manufacturing steps according to an embodiment in which the present invention is applied to a method of manufacturing an ion-implantation J-FET (junction type field effect transistor).

Figure 1A:
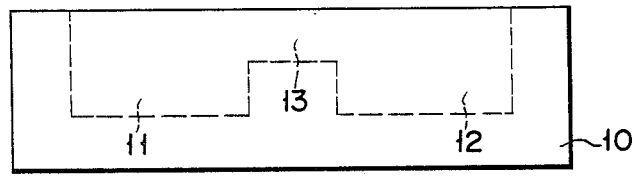
FIGS. 1A to 1F are sectional views showing the structures of the device formed in manufacturing steps of a method according to an embodiment of the present invention.

Process 1 (FIG. 1A)

Si is selectively ion-implanted in a major surface of GaAs substrate 10. At this time, ion-implantation is performed in prospective source and drain formation regions under conditions that acceleration voltage $V_{ac}$ is 180 KeV and dosage $Q_d$ is $5 \times 10^{13}/cm^2$, thereby forming ion-implantation layers 11 and 12. In addition, ion-implantation is performed in a prospective channel formation region under conditions that acceleration voltage $V_{ac}$ is 100 KeV and dosage $Q_d$ is $3 \times 10^{12}/cm^22$, thereby forming ion-implantation layer 13.

Figure 1B:
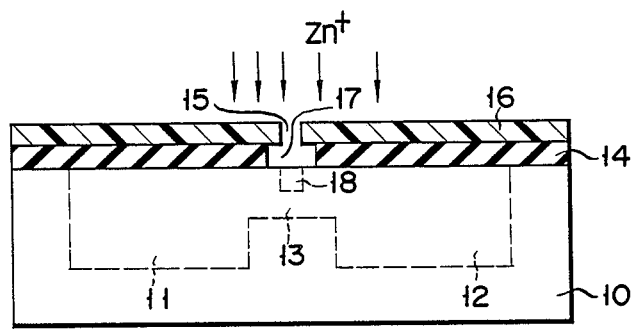

Process 2 (FIG. 1B)

SiO$_2$ film 14 is formed on the entire major surface of substrate 10 to have a thickness of 5,000 Å by CVD (chemical vapor deposition), and photoresist film 16 having opening portion 15 at a position corresponding to a gate region is formed on SiO$_2$ film 14. Subsequently, film 14 is etched by an isotropic etching technique using film 16 as a mask and an NH$_4$F solution, thereby forming opening portion 17 in film 14. Thereafter, Zn$^+$ is ion-implanted in layer 13 through opening portions 15 and 17 under conditions that acceleration voltage $V_{ac}$ is 80 KeV and dosage $Q_d$ is $1 \times 10^{15}/cm^2$, thereby forming ion-implantation layer 18 in layer 13.

Figure 1C:
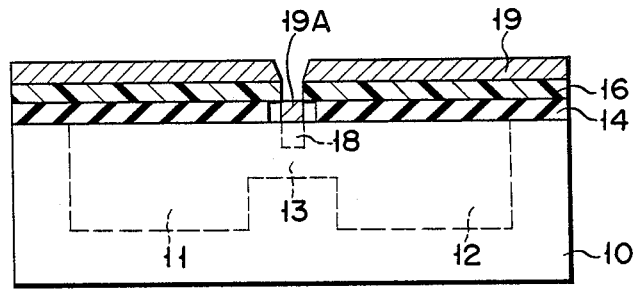

Process 3 (FIG. 1C)

Conductor layer 19 is formed on the entire major surface of the structure of the device. Conductor layer 19 comprises a 1,000-Å thick lower TiW layer and a 5,000-Å thick upper Au layer, which are formed in an Ar gas atmosphere by a sputtering process. The TiW layer is formed on film 16 and the Au layer is formed on the TiW layer. At this time, TiW and Au are sputtered on layer 13 through opening portion 15 of film 16 and opening portion 17 of film 14, thereby forming conductor layer 19A on layer 13. Materials other than TiW and Au may be used, as long as an ohmic contact between the layer formed of the materials and the gate region is not degraded, even when the layers are annealed in the following step. For example, a single layer containing a refractory metal such as a WN layer or a WSi layer may be used. Alternatively, a bi-layered structure having a lower WN layer contacting GaAs substrate 10 and an upper Au layer may be used. That is, any kind of layer may be used in place of the above layer of this embodiment as long as the layer contacting

Figure 1D:
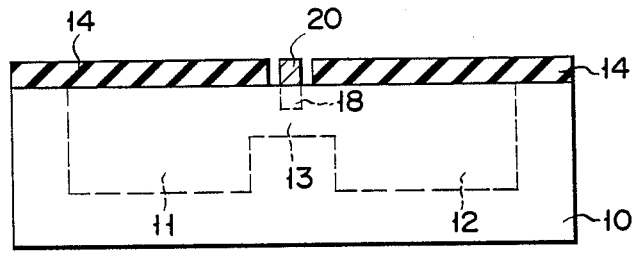

Process 4 (FIG. 1D)

By removing film 16, layer 19 formed on film 16 is simultaneously removed. That is, layer 19 is removed by a so-called "lift off" method. As a result, only layer 19A remains formed on layer 13 to form gate electrode 20.

Figure 1E:
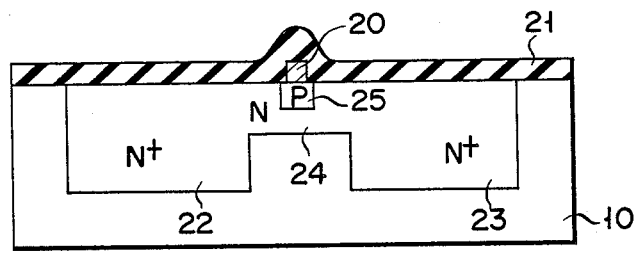

Process 5 (FIG. 1E)

After film 14 is removed, PSG film 21 is formed by the CVD process on the entire major surface of the structure to have a thickness of 5,000 Å. Thereafter, the structure is annealed for 15 minutes in an Ar gas at 800° C. to activate the ion-implanted impurity, thereby forming N$^+$-type source and drain regions 22 and 23, N-type channel region 24, and P-type gate region 25. By way of this annealing process, electrode 20 is formed in ohmic contact with region 25.

Figure 1F:
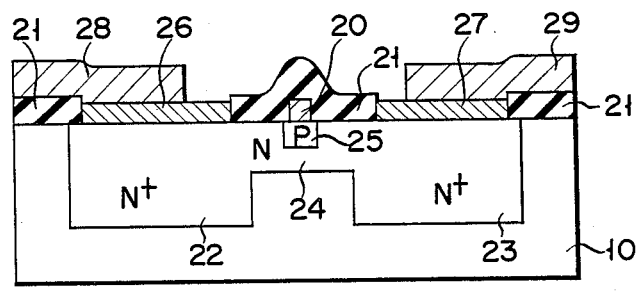

Process 6 (FIG. 1F)

Openings are formed in film 21 at positions corresponding to regions 22 and 23 to communicate with regions 22 and 23. Source and drain leading electrodes 26 and 27 each comprising a 2,000-Å thick lower AuGe film containing 5% of Ge and a 1,000-Å thick upper Au film are formed in the openings of film 21 by, e.g., a lift-off method. Thereafter, the structure is annealed at 400° C. for three minutes to form an ohmic contact between source region 22 and source leading electrode 26 and an ohmic contact between drain region 23 and drain leading electrode 27. Following this annealing process, source and drain electrodes 28 and 29 are formed on source and drain leading electrodes 26 and 27, respectively, by, e.g., a lift-off method. Source and drain electrodes 28 and 29 may be a superposed structure composed of a Ti layer - Pt layer - Au layer. In this way, the J-FET is completed.

In the FET manufactured by the method according to this embodiment, gate electrode 20 is in direct contact with gate region 25. Therefore, a gate resistance can be sufficiently reduced, and a noise factor and a gain at a high frequency is not degraded. In addition, since gate region 25 and gate electrode 20 are formed through opening portion 15 in photoresist film 16 by ion-implantation and sputtering, gate region 25 and gate electrode 20 are in self-alignment with each other. For this reason, even if region 25 is formed to occupy a small area, a positional deviation is not generated between region 25 and electrode 20, resulting in a high manufacturing yield.

In the above embodiment, after gate electrode 20 has been formed, the structure is annealed to form source and drain regions 22 and 23 and channel and gate regions 24 and 25. During this annealing process, the impurity in ion-implantation layer 18 is activated and gate region 25 is formed to extend in the lateral direction. Since region 25 extends in the lateral direction, there is almost no possibility of gate electrode 20 contacting channel region 24.

FIGS. 2A to 2G are sectional views of the structures formed in manufacturing steps according to another embodiment in which the present invention is applied to a method of manufacturing an ion-implantation J-FET (junction type field effect transistor).

Process 1 (FIG. 2A)

Si is selectively ion-implanted in a major surface of GaAs substrate 10. At this time, ion-implantation is performed in prospective source and drain formation regions under conditions that acceleration voltage $V_{ac}$ is 180 KeV and dosage $Q_d$ is $5 \times 10^{13}/cm^2$, thereby forming ion-implantation layers 11 and 12. In addition, ion-implantation is performed in a prospective channel formation region under conditions that acceleration voltage $V_{ac}$ is 100 KeV and dosage $Q_d$ is $3 \times 10^{12}/cm^2$, thereby forming ion-implantation layer 13.

Process 2 (FIG. 2B)

SiO$_2$ film 14 is formed by a CVD process (chemical vapor deposition) on the entire major surface of substrate 10 to have a thickness of 5,000 Å, and photoresist film 16 having opening portion 15 at a position corresponding to a gate region is formed thereon. Subsequently, film 14 is etched by an isotropic etching technique using film 16 as a mask and an NH$_4$F solution, thereby forming opening portion 17 in film 14. Thereafter, Zn$^+$ is ion-implanted in layer 13 through opening portions 15 and 17 under conditions that acceleration voltage $V_{ac}$ is 80 KeV and dosage $Q_d$ is $1 \times 10^{15}/cm^2$, thereby forming ion-implantation layer 18 in layer 13.

Process 3 (FIG. 2C)

Conductor layer 19 is formed on the entire major surface of the structure of the device. Conductor layer 19 comprises a 1,000-Å thick lower TiW layer and a 5,000-Å thick upper Au layer, which are formed in an Ar gas atmosphere by a sputtering technique. The TiW layer is formed on film 16 and the Au layer is formed on the TiW layer. At this time, TiW and Au are sputtered onto layer 13 through opening portion 15 of film 16 and through opening portion 17 of film 14, thereby forming conductor layer 19A on layer 13. Materials other than TiW and Au may be used, as long as an ohmic contact between the layer formed of the materials and the gate region is not degraded, even when the layers are annealed in the following step. For example, a single layer containing a refractory metal such as a WN layer or a WSi layer may be used. Alternatively, a bi-layered structure of a lower WN layer which is in contact with GaAs substrate 10 and an upper Au layer may be used. That is, any kind of layer may be used in place of the above layer of this embodiment as long as the layer contacting substrate 10 is made of a refractory metal.

Process 4 (FIG. 2D)

By removing film 16, layer 19 formed on film 16 is simultaneously removed. That is, layer 19 is removed by a so-called "lift off" method. As a result, only layer 19A formed on layer 13 remains to form gate electrode 20.

Process 5 (FIG. 2E)

Zn$^+$ is ion-implanted again in substrate 10 using film 14 and electrode 20 as masks under conditions that acceleration voltage $V_{ac}$ is 80 KeV and dosage $Q_d$ is $1 \times 10^{15}/cm^2$, thereby enlarging layer 18.

Process 6 (FIG. 2F)

After film 14 is removed, PSG film 21 is formed by the CVD process on the entire major surface of the structure to a thickness of 5,000 Å. Thereafter, the structure is annealed in an Ar gas at 800° C. for 15 minutes to activate the ion-implanted impurity, thereby forming N$^+$-type source and drain regions 22 and 23, N-type channel region 24, and P-type gate region 25. By way of this annealing process, electrode 20 is formed in ohmic contact with region 25.

Process 7 (FIG. 2G)

Openings are formed in film 21 at positions corresponding to regions 22 and 23 to communicate with regions 22 and 23. Source and drain leading electrodes 26 and 27 each comprising a 2,000-Å thick lower AuGe film containing 5% of Ge and 1,000-Å thick upper Au film are formed in the openings of film 21 by, e.g., a lift-off method. Thereafter, the structure is annealed at 400° C. for three minutes to form an ohmic contact between source region 22 and source leading electrode 26 and an ohmic contact between drain region 23 and drain leading electrode 27. Following this annealing process, source and drain electrodes 28 and 29 are formed on source and drain leading electrodes 26 and 27, respectively, by, e.g., a lift-off method. Source and drain electrodes 28 and 29 may be a superposed structure composed of a Ti layer - Pt layer - Au layer. In this way, the J-FET is completed.

In the FET manufactured by the method according to this embodiment, gate electrode 20 directly contacts gate region 25. Therefore, a gate resistance can be sufficiently reduced, and a noise factor and a gain at a high frequency is not degraded. In addition, since gate region 25 and gate electrode 20 are formed through opening portion 15 in photoresist film 16, by ion-implantation and sputtering, gate region 25 and gate electrode 20 are in self-alignment with each other. For this reason, even if region 25 is formed to occupy a small region, a positional deviation is not generated between region 25 and electrode 20, resulting in a high manufacturing yield.

In this embodiment, process 5 described with reference to FIG. 2E is added to the embodiment described above with reference to FIGS. 1A to 1F. That is, after gate electrode 20 is formed in process 4 (FIG. 2D), Zn$^+$ is again ion-implanted in substrate 10 using film 14 and electrode 20 as masks under the conditions that acceleration voltage $V_{ac}$ is 80 KeV and dosage $Q_d$ is $1 \times 10^{15}/cm^2$ in process 5 (FIG. 2E). Therefore, layer 18 which is to serve as gate region 25 is larger than that in the embodiment shown in FIGS. 1A to 1E. Since region 25 is enlarged in the lateral direction with respect to electrode 20, electrode 20 is prevented from contacting channel region 24.

That is, conductor layer 19A which constitutes gate electrode 20 is formed by a sputtering process. At this time, since a sputtering direction of a conductor layer material is offset by a set angle range of a target, layer 19A may be formed to be larger than a predetermined size, although this is very rare. Even in this case, according to the embodiment shown in FIGS. 2A to 2G, gate electrode 20 is prevented from contacting channel region 24 since gate region 25 is enlarged in the lateral direction with respect to electrode 20.

FIGS. 3A to 3E are sectional views of the structures of the device formed in manufacturing steps according to an embodiment in which the present invention is applied to a method of manufacturing an epitaxial growth J-FET.

Process 1 (FIG. 3A)

N-type GaAs semiconductor layer 31 is formed on GaAs substrate 30 by an epitaxial growth method. Then, photoresist film 33 having opening portion 32 at a position corresponding to a gate region is formed on layer 31. Layer 31 is selectively etched using film 33 as a mask to form groove 34 having a depth corresponding to a predetermined threshold value. At this time, etching is performed using an etching solution having a volume ratio of phosphoric acid : hydrogen peroxide solution : pure water = 3:1:50.

Figure 3B:
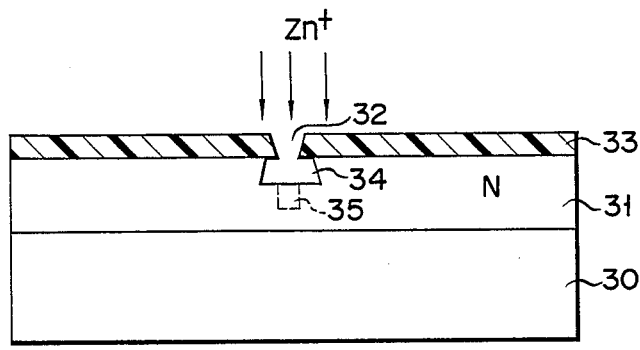

Process 2 (FIG. 3B)

Thereafter, $Zn^+$ is ion-implanted in layer 31 through opening portion 32 of film 33 and groove 34 of layer 31 under conditions that acceleration voltage $V_{ac}$ is 80 KeV and dosage $Q_d$ is $1 \times 10^{15}/cm^2$, thereby forming ion-implantation layer 35 in layer 31 at a region corresponding to groove 34.

Figure 3C:
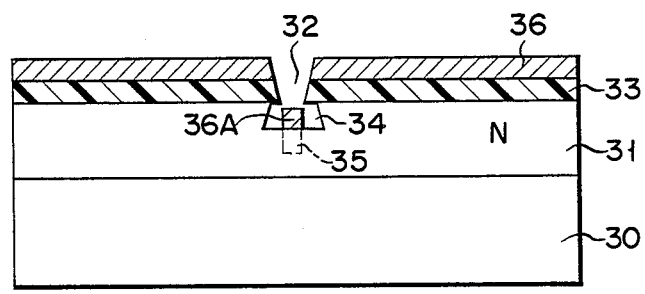

Process 3 (FIG. 3C)

Then, to be used as metal layers for forming a gate electrode, a 1,000-Å thick lower TiW layer and a 5,000-Å thick upper Au layer are formed in an Ar gas by sputtering, thereby forming conductor layer 36. The TiW layer is formed on film 16 and the Au layer is formed on the TiW layer. At this time, TiW and Au are sputtered on layer 35 through opening portion 32 formed in film 33 to form conductor layer 36A on layer 31. Materials other than TiW and Au may be used, as long as an ohmic contact between the layer formed of the materials and the gate region is not degraded, even when the layers are annealed in the following step. For example, a single layer containing a refractory metal such as a WN layer or a WSi layer may be used. Alternatively, a bi-layered structure of a lower WN layer which contacts GaAs semiconductor layer 31 and an upper Au layer may be used. That is, any kind of layer may be used in place of the above layer as long as a layer contacting layer 31 is made of a refractory metal.

Figure 3D:
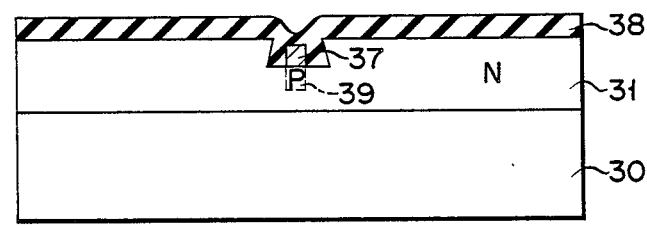

Process 4 (FIG. 3D)

By removing film 33, layer 36 formed on the surface of film 33 is simultaneously removed. That is, layer 36 is removed by a so-called "lift off" method. As a result, only layer 36A remains formed on layer 31 to form gate electrode 37. Thereafter, PSG film 38 is formed by the CVD process on the entire major surface of the structure to have a thickness of 5,000 Å. Then, the structure is annealed in an Ar gas at 800° C. for 15 minutes to activate the impurity ion-implanted in layer 35, thereby forming P-type gate region 39. By way of this annealing process, gate electrode 37 is formed in ohmic contact with gate region 39.

Figure 3E:
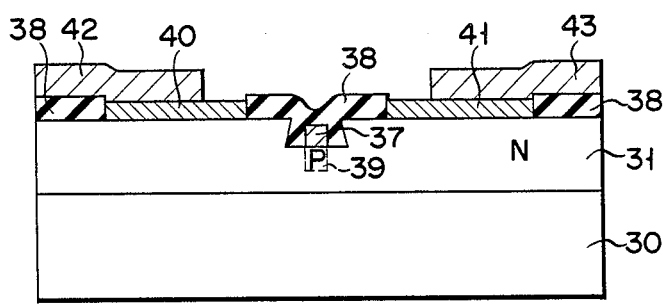

Process 5 (FIG. 3E)

Openings are formed in film 38 at positions corresponding to the source and drain regions (not shown) in semiconductor layer 31 to communicate therewith. Source and drain leading electrodes 40 and 41 each comprising 2,000-Å thick lower AuGe film containing 5% of Ge and a 1,000-Å thick upper Au film are formed in the openings by, e.g., a lift-off method. Thereafter, the structure is annealed at 400° C. for three minutes to form an ohmic contact between the source region and source leading electrode 40 and an ohmic contact between the drain region and drain leading electrode 41.

Following this annealing process, source and drain electrodes 42 and 43 are formed on source and drain leading electrodes 40 and 41, respectively, by, e.g., a lift-off method. Source and drain electrodes 42 and 43 may be a superposed structure composed of a Ti layer - Pt layer - Au layer. In this way, the J-FET is completed.

In the FET manufactured by the method of this embodiment, gate electrode 37 directly contacts gate region 39. Thus, a gate resistance can be sufficiently reduced, and a noise factor and a gain at a high frequency is not degraded. In addition, since gate region 39 and gate electrode 37 are formed through opening portion 32 of film 33, by ion-implantation and sputtering, gate region 39 and gate electrode 37 are in self-alignment with each other. For this reason, even if region 39 is formed to occupy a small area, no positional deviation is generated between region 39 and electrode 37, resulting in high manufacturing yield.

As has been described above, according to the present invention, an FET in which a gate electrode can be positioned with respect to a small gate region with high accuracy and which is suitable for high frequency applications can be manufactured.

What is claimed is:

1. A method of manufacturing a semiconductor device comprising:
   implanting ions of an impurity in a compound semiconductor substrate and forming a first ion-implanting layer of a first conductivity type on a major surface layer of said substrate;
   forming a first insulating film on the major surface of said substrate;
   forming a second insulating film having an opening portion on said first insulating film;
   forming an opening portion in said first insulating film by selective etching using said second insulating film as a mask;
   implanting ions of an impurity in said first ion-implantation layer through said opening portion of said second insulating film and forming a second ion-implantation layer of a second conductivity type in a surface layer thereof;
   forming, on the major surface of said structure, while said second insulating film remains, conductor layers in which at least a layer thereof contacting said semiconductor substrate is either a refractory metal layer or a layer containing a refractory metal;
   removing said second insulating film to remove said conductor layer portion formed thereon, thereby forming an electrode so that only said conductor layer portion exposed in said opening portion of said second insulating film and formed on said substrate remains;
   implanting impurity ions of the second conductivity type in said first ion-implantation layer using said electrode and said first insulating film as masks; and
   annealing said structure to activate said first and second ion-implantation layers.

* * * * *